United States Patent [19]
Saijo et al.

[11] Patent Number: 5,455,515
[45] Date of Patent: Oct. 3, 1995

[54] CONNECTOR INSPECTING DEVICE

[75] Inventors: Eiji Saijo; Masahiko Aoyama; Keigo Atsumi, all of Yokkaichi, Japan

[73] Assignee: Sumitomo Wiring Systems, Ltd., Mie, Japan

[21] Appl. No.: 308,265

[22] Filed: Aug. 29, 1994

[30] Foreign Application Priority Data

Oct. 15, 1993 [JP] Japan .................... 5-281716

[51] Int. Cl.$^6$ .................................. G01R 31/02
[52] U.S. Cl. .................... 324/538; 324/761; 439/595; 439/488
[58] Field of Search .................. 324/537, 538, 324/754, 756, 761; 439/595, 488, 489, 490

[56] References Cited

U.S. PATENT DOCUMENTS

| | | | |
|---|---|---|---|
| 4,750,893 | 6/1988 | Sueyoshi et al. | 439/596 |
| 4,806,123 | 2/1989 | Konishi et al. | 439/595 |
| 4,902,968 | 2/1990 | Sugimoto | 324/537 |
| 5,335,413 | 8/1994 | Yamamoto et al. | 324/538 X |
| 5,370,543 | 12/1994 | Hamada et al. | 439/489 X |

FOREIGN PATENT DOCUMENTS

| | | |
|---|---|---|
| 0-551-128 | 7/1993 | European Pat. Off. . |
| 0-565-080 | 10/1993 | European Pat. Off. . |
| 62-47093 | 12/1987 | Japan . |

*Primary Examiner*—Kenneth A. Wieder
*Assistant Examiner*—Glenn W. Brown
*Attorney, Agent, or Firm*—Oliff & Berridge

[57] ABSTRACT

A connector inspecting device that positively determines whether a metal terminal has been correctly inserted into the housing of the connector includes a slider provided in a checker housing in such a manner that it is movable and urged toward a connector by a compression spring. The slider includes a lance check pin protruded toward the connector and an electrical contactor that is integral with the lance check pin. When the connector is at a "normal position," the lance check pin goes in a lance bending space provided for a lance, so that the electrical contactor is electrically connected to the metal terminal. In the case where the metal terminal is set at a "half insertion position," the lance check pin abuts against the lance, which prevents the contact of the electrical contactor with the metal terminal.

20 Claims, 3 Drawing Sheets

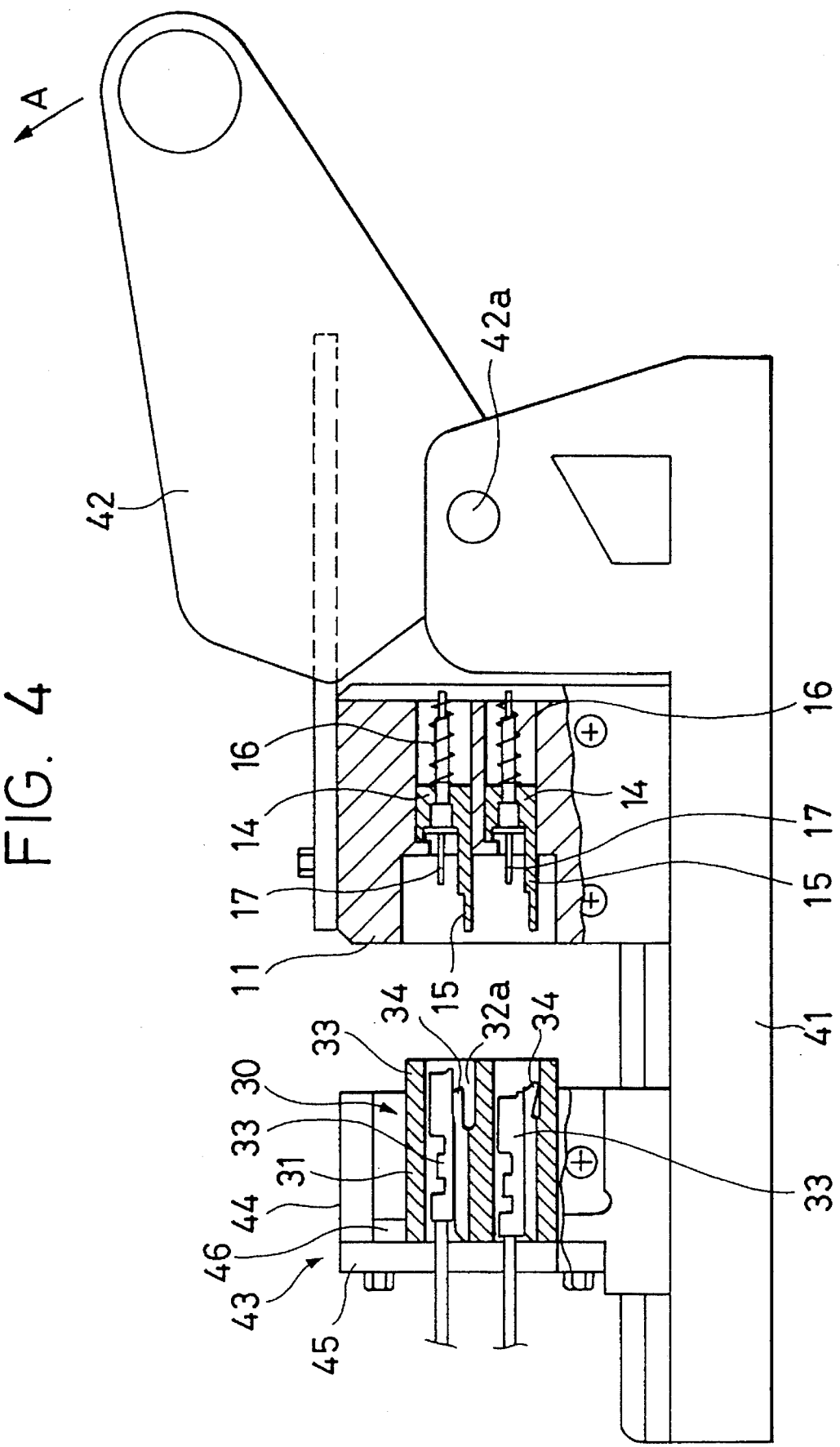

CONNECTOR INSPECTING DEVICE

BACKGROUND OF THE INVENTION

1. Field of the Invention

This invention relates to a connector inspecting device for detecting whether or not a metal terminal has been satisfactorily set in a connector housing.

2. Description of the Related Art

A connector includes a connector housing that is generally made of resin and metal terminals connected to the end of an electrical wire, which is inserted into the connector housing. Each of the metal terminals is fixedly held with a lance (or an elastic locking pawl) extended from the connector housing so that it may not come off the connector housing. When each of the metal terminals is inserted into the connector housing, the respective lance is bent toward the lance bending space provided in the connector housing. When the metal terminal has been correctly inserted into the connector housing; that is, when it is at a "normal position," the lance is elastically restored to engage the metal terminal, so that the metal terminal is prevented from coming off the connector housing.

However, the connector having the above-described terminal retaining structure may suffer from the following difficulty: When the metal terminal is inserted until the lance is bent, some frictional force acts on the metal terminal, thus falsely retaining the metal terminal. In this case, the person inserting the metal terminal into the connector housing may consider that the metal terminal has been completely inserted into the connector housing, and stop the insertion of the metal terminal.

If the metal terminal is not inserted to the "normal position" where it is engaged with the lance of the connector housing, the metal terminal may come off during the use of the connector. Hence, it is essential to detect whether the metal terminal of the electrical wire has been correctly inserted into the connector housing.

There have been proposed a variety of connector inspecting devices. One example is disclosed by Japanese Utility Patent Application Publication No. 47093/1987. The connector inspecting device includes a connector holder for holding a connector at a predetermined position and lance check pins protruded toward the lances of the connector held at the predetermined position. More specifically, the lance check pins are extended toward the lance bending spaces, and they are brought into contact with the ends of the lances, which are positioned in the lance bending spaces when the insertion of the metal terminal into the connector housing is incomplete. Thus, with the device, it can be determined whether or not the metal terminal has been satisfactorily set in the connector housing.

However, the above-described conventional connector inspecting device is still disadvantageous in the following points: If, in spite of the fact that a metal terminal has been insufficiently inserted into the connector housing, the connector is forcibly set on the connector holder, the lance check pin is strongly pushed against the lance, thus deforming the lance. If the lance is deformed in the above-described manner, then it is possible to set the unsatisfactory connector in the connector holder in the same position as in the case of the satisfactory connector in which the metal terminals have been correctly inserted. In this case, it is impossible to detect the incorrect insertion of the metal terminal. In addition, the lance is then damaged, which makes it impossible to use the connector. The damage to the lance is liable to occur especially with a connector inspecting device in which a cam mechanism is employed to forcibly move the lance check pins in the connector housing.

SUMMARY OF THE INVENTION

In view of the foregoing, an object of the invention is to provide a connector detecting device that can positively determine whether the metal terminal has been correctly inserted into the connector housing; that is, the connector can be inspected with high reliability, and damage to the lance is prevented.

The foregoing and other objects of the invention have been achieved by providing a connector inspecting device including a lance check pin protruded toward the lance of the connector and movable toward the lance, the lance check pin being allowed to contact the lance when the metal terminal has been unsatisfactorily set in the connector housing; an electrical contactor that is movable together with the lance check pin, the electrical contactor being allowed to contact the metal terminal when the metal terminal has been set at a normal position in the connector housing, thus being prevented from coming off; and an urging device for urging the lance check pin and the electrical contactor toward the connector.

In accordance with another aspect of the invention, a connector inspecting device includes a checker housing with a setting section adapted to receive the connector under test, and a slider provided in the checker housing in such a manner that it is movable toward and away from the connector. The slider may include a lance check pin that is protruded toward the lance and is allowed to contact the lance when the metal terminal has been unsatisfactorily set in the connector housing; an electrical contactor that is allowed to contact the metal terminal when the metal terminal has been set at a normal position in the connector housing, thus being prevented from coming off; and an urging device for urging the lance check pin and the electrical contactor toward the connector.

In yet another aspect of the invention, a connector inspecting device is provided, including a connector holder for holding the connector under test; a checker housing confronted with the connector holder; a driver for moving the connector holder and/or the checker housing toward each other; and a slider that is provided in the checker housing in such a manner that the slider is movable toward the connector.

The electrical contactor may be connected to a wire harness continuity detecting circuit.

When the metal terminal has been correctly inserted in the connector housing; that is, when it is held at the "normal position" in the connector housing, the lance of the connector housing is engaged with the metal terminal. However, when the insertion of the metal terminal is insufficient; that is, it is located before the "normal position," the lance is bent into the lance bending space in the connector housing, and is not engaged with the metal terminal.

When the connector has been inserted to the "normal position" in the connector housing, the lance check pin is not brought into contact with the lance even when the connector is engaged with the connector inspecting device. Therefore, the electrical contactor moving together with the lance check pin is brought into contact with the metal terminal. Where, on the other hand, the metal terminal is insufficiently inserted into the connector housing, the lance check pin, being urged by the urging device, is brought into contact with the lance, thus being prevented from advancing toward the metal terminal. Thus, the electrical contactor is not brought into contact with the metal terminal; that is, the former is not electrically connected to the latter.

In accordance with another aspect of the invention, the connector is set in the checker housing before being inspected. In the case where the connector is not sufficiently inserted in the connector housing, that is, when it is not at the "normal position," the lance check pin abuts against the lance, so that the slider is retracted away from the connector, and the electrical contactor is not allowed to contact the metal terminal. In the case where the connector is set at the "normal position" in the connector housing, the lance check pin does not contact the lance, so that the slider, being urged by the urging device, is moved toward the lance, while the electrical contactor is moved toward the metal terminal, thus being electrically connected to the latter.

In accordance with still another aspect of the invention, the connector is set in the connector holder, and the driver is operated to move the checker housing and the connector holder toward each other. Similarly, as in the case of the connector inspecting device, when the metal terminal is insufficiently inserted into the connector housing, that is, it is not at the "normal position," the lance check pin abuts against the lance. As a result, the slider, movably provided in the checker housing, is retracted so as not to meet the metal terminal, and therefore the electrical contactor is not brought into contact with the metal terminal. In the case where the connector is set at the "normal position" in the connector housing, the lance check pin does not contact the lance, so that the slider, being urged by the urging device, is moved toward the lance, and at the same time the electrical contactor is moved toward the metal terminal, thus being electrically connected to the latter.

Thus, whether or not the metal terminal has been correctly set in the connector housing can be readily determined according to continuity or non-continuity between the metal terminal and with the electrical contactor.

Furthermore, in the case where the electrical contactor is connected to the wire harness continuity detecting circuit, the continuity of the wire harness and the position of the metal terminal can be inspected at the same time.

BRIEF DESCRIPTION OF THE DRAWINGS

The invention will now be described in detail with reference to the accompanying drawings, in which:

FIG. 4 is a sectional view showing another example of the connector inspecting device, which constitutes a second embodiment of the invention.

DETAILED DESCRIPTION OF PREFERRED EMBODIMENTS

First Embodiment

Figure 1:
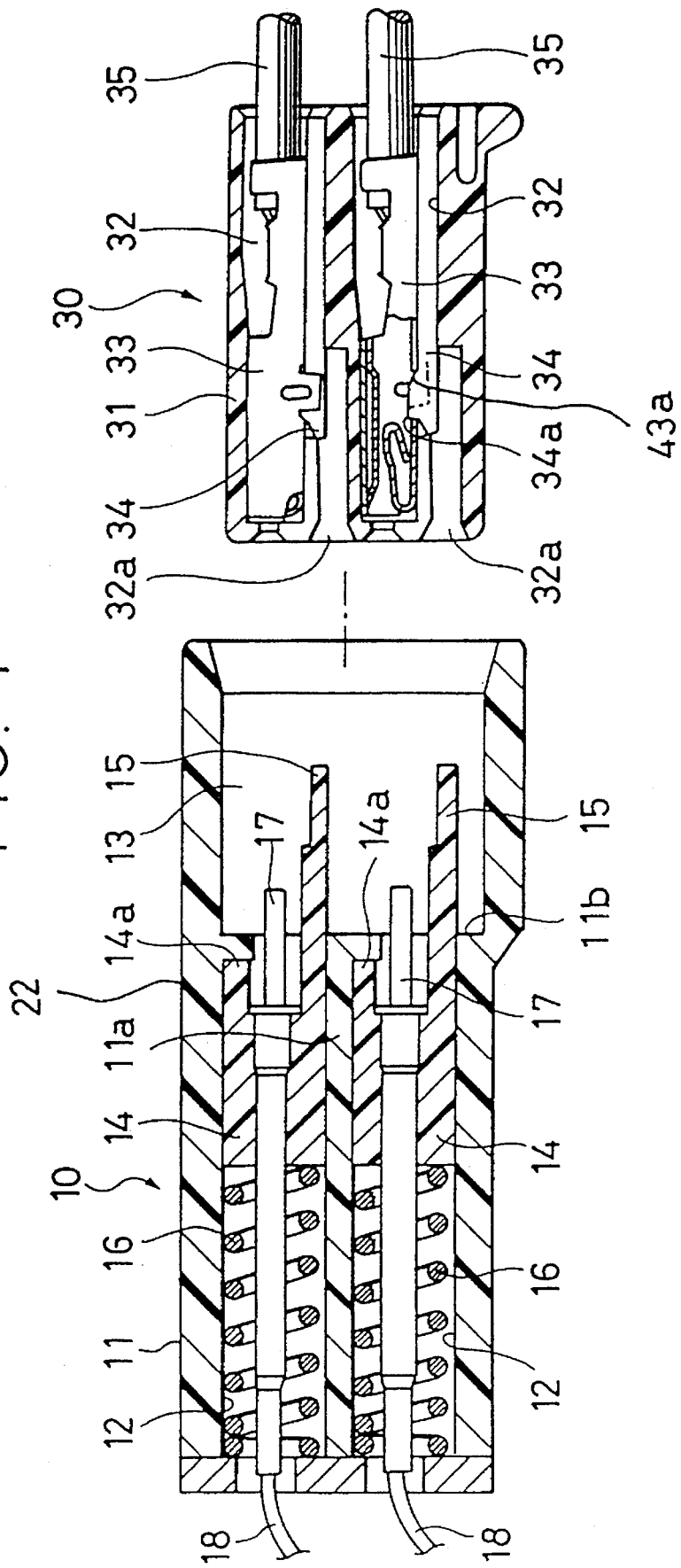
FIG. 1 is a sectional view showing one example of a connector inspecting device, which constitutes a first embodiment of the invention.

A first embodiment of the invention will be described with reference to FIGS. 1 through 3.

First, the structure of a connector 30 will be described, which is inspected with a connector inspecting device 10, which constitutes the first embodiment of the invention.

The connector housing 31 is made of resin, and it is substantially in the form of a rectangular box and includes a plurality of cavities 32 arranged on the upper and lower stages. The cavities 32 are extended in the front-to-rear direction of the connector housing. A metal terminal 33 is inserted into each of the cavities (right in FIG. 1). Lances 34 are formed integral with the connector housing 31 so as to fixedly hold the metal terminals 33.

Each of the lances 34 is a protrusion that is elastically deformable and has a locking portion 34a at the end. For each lance 34, a lance bending space 32a is formed in the cavity 32 to allow the lance 34 to elastically bend downwardly. In the embodiment, the metal terminal 33 is a female terminal that is engaged with a male metal terminal of the mating connector (not shown); that is, it is a conventional one that is fixedly fastened to an electrical wire 35 by crimping. As the metal terminal 33 is inserted into the cavity 32, the end of the metal terminal 33 abuts against the lance 34 to elastically bend the lance 34 toward the lance bending space 32a. As the metal terminal 33 is further inserted into the cavity 32, the locking portion 34a of the lance 34 thus elastically bent meets the engaging hole 43a of the metal terminal 33, so that the lance is restored, and the locking portion 34a is engaged with the engaging hole 43a. Thus, the metal terminal 33 has been fixedly held, being prevented from coming off the connector housing.

Figure 2:
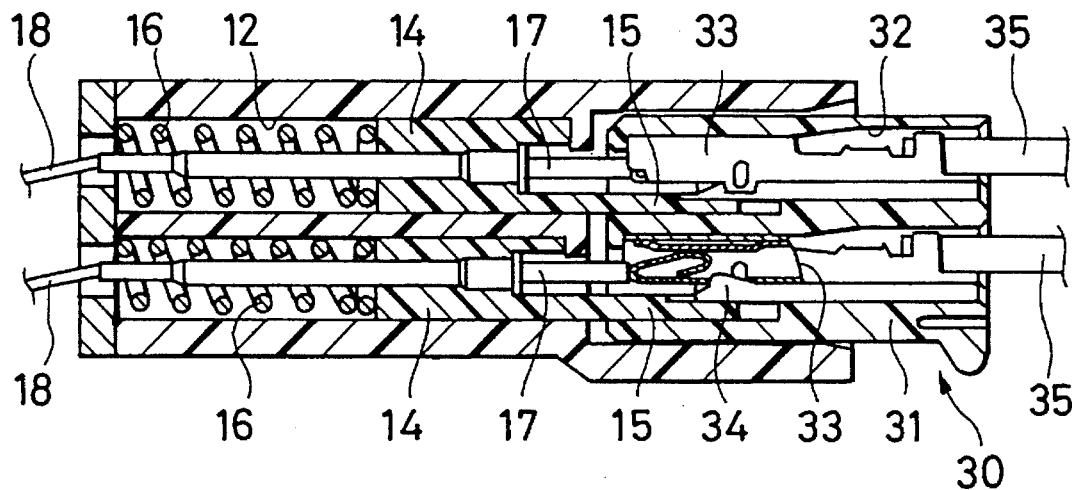
FIG. 2 is a sectional view showing the connector inspecting device with a connector set therein.
Figure 3:
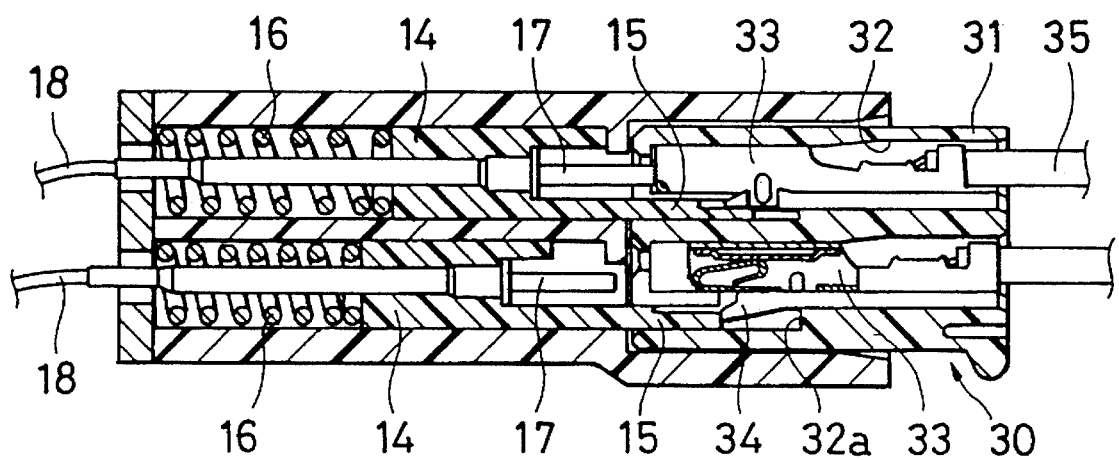
FIG. 3 is a sectional view showing the connectors inspecting device with a connector set therein in which a metal terminal is insufficiently inserted.

The engagement of the lance 34 will become more apparent when read in conjunction with FIGS. 2 and 3. That is, FIG. 2 shows a metal terminal 33 on the lower stage that has been inserted to the "normal position," thus being completely engaged with the lance 34. In FIG. 3, a metal terminal 33 on the lower stage does not reach the "normal position" yet; that is, it is inserted to an "incomplete insertion position" where the lance 34 is elastically bent toward the lance bending space 32a.

Now, the connector inspecting device 10 for inspecting the above-described connector 30 will be described.

The connector inspecting device 10 has a checker housing 11 of resin. The inside of the checker housing 22 is divided into a plurality of small chambers, namely, cavities 12 by partition walls 11. The number of the cavities 12 is equal to that of the cavities 32 of the connector housing 31. The checker housing 11 includes a rectangular hood 13 in front of the cavities 12 into which the connector housing 31 of the connector 30 to be inspected is inserted.

In each of the cavities 12, a slider 14 of resin is slidably provided. A lance check pin 15 integral with the slider 14 is extended toward the hood 13 through a through-hole 11b formed in the partition wall 11a. More specifically, the lance check pin 15 is so positioned that it is able to go into the lance bending space 32a of the connector housing 32 set in the hood 13, and therefore, in the case where the metal terminal 33 of the connector 30 is at the "incomplete insertion position" and the end portion of the lance 34 is bent into the lance bending space 32a, the lance check pin is caused to abut against the lance 34 (described later in more detail). The end portion of each of the lance check pins 15 is relatively thin so that it may not be caught by the lance 34 engaged with the metal terminal.

Each of the sliders 14 is kept urged by energizing means, namely, a compression spring 16 that is held compressed in the cavity 12. Before the connector 30 is engaged with the hood 13 of the checker housing 11, as shown in FIG. 1, a stopper 14a protruded from the slider 14 abuts against the partition wall 11a, and the lance check pin 15 is fully protruded into the hood 13.

An electrical contactor 17 made of an electrically conductive metal bar is fixedly inserted into each of the sliders 14, for instance, by press-fitting in such a manner that it is extended in parallel with the respective lance check pin. More specifically, the electrical contactor 17 is extended less than the lance check pin 15, and the electrical contactor 17 thus extended is so limited in length that, when the connector housing 31 is inserted into the hood 13, its end is brought into contact with the end of the metal terminal 33 set at the "normal position."

The electrical contactors 17 are connected through lead wires 18 to a continuity detecting circuit (not shown). The continuity detecting circuit detects whether the metal terminals 33 have been correctly inserted into the respective cavities 32 of the connector 30. The circuit is a conventional one that includes a continuity detecting power source and performs a continuity test according to whether current flows between the metal terminals of the two connectors connected to both ends of the wire harness.

The functions of the connector inspecting device according to the invention will be described.

The metal terminals connected to the ends of electrical wires 35 are inserted into the respective cavities 32 of the connector housing, and the electrical wires 35 are bundled with tape to provide a wire harness. The wire harness thus formed is given a test of determining whether the metal terminals have been correctly inserted into the connector housing (hereinafter referred to as "an insertion test," when applicable) and the aforementioned continuity test. The wire harness is set on a predetermined inspecting board, and the connector 30 is inserted into the hood 13 of the checker housing 22 of the connector inspecting device 10 (cf. FIG. 2).

When, in this case, the metal terminals 33 of the connector 30 are at the respective "normal positions" where they are engaged with the respective lances 34 of the connector housing 31, the lance bending spaces 32a below the lances 34 are empty, and the end portions of the lance check pins 15 go into the lance bending spaces 32a without being obstructed by the lances 34. Hence, the sliders 14 are pushed by the elastic force of the elastic means 16 so that their lance check pins 15 are fully protruded into the hood 13. Accordingly, the electrical contactors 17 integral with the sliders 14 are maximumly protruded toward the connector 30. As a result, the ends of the electrical contactors 17 are brought into contact with the ends of the metal terminals 33; that is, the former 17 are electrically connected to the latter 33. Thus, in this case, with the continuity detecting circuit, the fact that metal terminals 33 are located at the "normal positions" and inserted into the predetermined cavities 32 is detected.

On the other hand, in the case where, as shown in FIG. 3, one of the metal terminals 33 on the lower stage is not fully inserted into the cavity, that is, it is at a "half insertion position," the metal terminal 33 pushes the lance 34 into the lance bending space 32. Hence, when the connector 30 is set in the hood 13 of the checker housing, the lance check pin 15 abuts against the lance 34 of the connector housing 31, so that the slider 14 is pushed to the left in FIG. 3 while compressing the compression spring 16, and accordingly, the electrical contactor 17 integral with the slider 14 is also pushed to the left, thus being unable to contact the metal terminal 33. That is, the electrical contactor 17 is not electrically connected to the metal terminal 33. Thus, in this case, with the continuity detecting circuit, it can be detected that the metal terminal is in an abnormal state.

As was described above, in the case where the lance 34 is held bent into the lance bending space 32a, the lance check pin 15 abuts against the lance 34, as a result of which, in inserting the connector 30 into the hood 13 of the checker housing 11, the insertion resistance is increased. However, the connector 30 can be set in the hood 13 as it is because in this case, the lance check pin 15 is pushed to the left while compressing the compression spring 16, and therefore no excessive pressure is applied to the lance 34; that is, the lance 34 is positively prevented from damage.

As was described above, the lance check pin 15 and the electrical contactor 17 are moved as one unit. Therefore, if, when the connector 30 is set in the hood 13, the metal terminal 33 is at the "half insertion position," and the lance 34 is bent into the lance bending space 32a, then the lance check pin 15 abuts against the lance 34, so that the electrical contactor 17 is moved away from the metal terminal 33. In other words, the electrical contactor 17 is not brought into contact with the metal terminal 33 any longer. Thus, it can be detected that the metal terminal 33 inserted into the cavity is in an abnormal state. In this case, the slider 14 is movable. Hence, even if the lance check pin abuts against the lance 34, the slider is retracted away from the lance 34; that is, no excessive pressure is applied to the lance 34. Thus, the lance is positively prevented from damage.

In the above-described embodiment, the electrical contactors 17 are connected to the continuity detecting circuit. Hence, detection of the locations of the lances; that is, determination as to whether or not the lances are at the "normal positions," and determination as to whether or not the metal terminals 33 have been inserted into the predetermined cavities 32, can be achieved at the same time. This means that the connector inspection work with the connector inspecting device of the invention is accurate, and the connectors can be inspected with high efficiency. Furthermore, in the embodiment, the sliders 14 are provided in the cavities 13 of the checker housing 22, respectively, and the sliders 14, each including the lance check pin 15 and the electrical contactor 17, can be provided as the same units. Therefore, in the case where the connector to be tested is changed in the number of poles (metal terminals), it can be tested by changing the number of the units in the connector inspecting device according to the number of poles of the connector. That is, the connector inspecting device can easily handle different connectors. Even if any one of the units becomes unusable, the device can be used again merely by replacing the unit. Thus, the device is excellent in maintenance.

Second Embodiment

FIG. 4 shows another example of the connector inspecting device, which constitutes a second embodiment of the invention.

The second embodiment is different from the above-described first embodiment fundamentally in that the checker housing 11 is mechanically movable toward the connector 30. The other arrangements are the same as those of the first embodiment. Therefore, hereinafter only the arrangement different from that of the first embodiment will be described with parts corresponding functionally to those of the first embodiment designated by the same reference numerals or characters in FIG. 4.

The checker housing 11 is provided on a base board 41 in such a manner that it is movable right and left in FIG. 4. More specifically, the checker housing 11 is moved by turning a cam handle 42 that is swingable about a shaft 42a supported by the base board 42. The lance check pins 15 and the electrical contactors 17 are the same as those in the first embodiment.

A connector holder 43 is fixedly mounted on the left end portion of the base board 41 as shown in FIG. 4. The connector holder 43 comprises a U-shaped supporting block 44 and a U-shaped back plate 45 that is detachably connected to the supporting block 44. An upwardly opened connector fixing groove 46 is formed between the U-shaped supporting block 44 and the U-shaped back plate 45. Protrusions (not shown) extending from the outer surface of the connector housing 31 are fitted in the connector fixing groove 45 from above. By guiding the protrusions vertically, the connector housing 31 is held positioned in the supporting block 44; that is, the connector housing 31 is so set that it is no longer movable right and left.

The connector inspecting device thus constructed operates as follows:

First, the connector 30 under test is inserted into the connector holder 43 from above. Under this condition, the cam handle 42 is turned in the direction of arrow A to move the checker housing 11 to the left in FIG. 4. Therefore, the lance check pins 15 and the electrical contactors 17 are moved toward the connector 30. Similarly as in the case of the above-described first embodiment, the lance check pins 15 go in the lance bending spaces 32a below the lances 34 while the electrical contactors 17 move toward the metal terminals 33. Thus, the second embodiment has the same effects as the first embodiment. That is, it is determined whether the metal terminals 33 have been inserted into the predetermined cavities 32, and it is also determined whether the metal terminals 33 have been correctly connected.

In the above-described embodiments, the means for urging the lance check pins 15 are the coil springs 16; however, the invention is not limited thereto. That is, instead of the coil springs, other elastic members made of rubber for instance may be employed. Furthermore, the lance check pins 15 may be urged toward the connector 30 by utilizing gravity or air pressure. Those modifications fall within the concept of the term "urging means" used with the invention. In the second embodiment shown in FIG. 4, the checker housing 11 is moved by turning the cam handle 42. However, the second embodiment may be so modified that the checker housing 11 is fixed, whereas the connector holder 43 is moved; or the checker housing 11 and the connector holder 43 are simultaneously moved toward each other.

As was described above, when, in the connector inspecting device according to the invention, the lance check pin abuts against the lance, the lance check pin is retracted so that the electrical contactor is not electrically connected to the metal terminal. This feature makes it possible to positively detect whether or not the metal terminal has been correctly set in the connector housing. Thus, the device is high in reliability. In addition, no excessive force is applied to the lance; that is, the lance is prevented from being damaged.

While the invention has been described in connection with preferred embodiments, it will be apparent to those skilled in the art that various changes and modifications may be made therein without departing from the invention, and it is aimed, therefore, to cover in the appended claims all such changes and modifications as fall within the true spirit and scope of the invention.

What is claimed is:

1. A connector inspecting device for inspecting a connector including a connector housing and a metal terminal inserted into said connector housing, said metal terminal being prevented from coming off by a lance disposed in said connector housing, said inspecting device comprising:

a lance check pin protruding toward said lance and movable toward said lance, said lance check pin engaging said lance when said metal terminal has been unsatisfactorily set in said connector housing;

an electrical contactor movable with said lance check pin, said electrical contactor contacting said metal terminal when said metal terminal has been set at a normal position in said connector housing, thus being prevented from coming off; and urging means for urging said lance check pin and said electrical contactor toward said connector.

2. A connector inspecting device according to claim 1, wherein said urging means comprises a spring urging said check pin and said electrical contactor toward said connector.

3. A connector inspecting device according to claim 1, further comprising:

a cavity housing said lance check pin; and a slider movably disposed in said cavity, said lance check pin being integral with said slider.

4. A connector inspecting device according to claim 3, wherein said electrical contactor is coupled to said slider for movement with said slider.

5. A connector inspecting device according to claim 4, wherein said urging means comprises a spring disposed around said electrical contactor, said spring disposed between a rear wall of said cavity and said slider.

6. A connector inspecting device according to claim 5, wherein said cavity comprises a stop disposed on an opposite side of said slider from said rear wall, said stop limiting movement of said slider toward said connector.

7. A connector inspecting device according to claim 4, wherein said electrical contactor is electrically connected through a lead wire to a wire harness continuity detecting circuit.

8. A connector inspecting device for inspecting a connector including a connector housing and a metal terminal inserted into said connector housing, said metal terminal being prevented from coming off by a lance disposed in said connector housing, said inspecting device comprising:

a checker housing with a setting section adapted to receive said connector; and a slider provided in said checker housing, said slider being movable toward and away from said connector in said checker housing, said slider including:

a lance check pin protruding toward said lance and contacting said lance when said metal terminal has been unsatisfactorily set in said connector housing;

an electrical contactor engaging said metal terminal when said metal terminal has been set at a normal position in said connector housing, thus being prevented from coming off; and urging means for urging said lance check pin and said electrical contactor toward said connector.

9. A connector inspecting device according to claim 8, wherein said urging means comprises a spring urging said check pin and said electrical contactor toward said connector.

10. A connector inspecting device according to claim 8, wherein said checker housing comprises a cavity, and wherein said slider is movably disposed in said cavity and said lance check pin is integral with said slider.

11. A connector inspecting device according to claim 10, wherein said electrical contactor is coupled to said slider for movement with said slider.

12. A connector inspecting device according to claim 11, wherein said urging means comprises a spring disposed around said electrical contactor, said spring disposed between a rear wall of said cavity and said slider.

13. A connector inspecting device according to claim 12, wherein said cavity comprises a stop disposed on an opposite side of said slider from said rear wall, said stop limiting movement of said slider toward said connector.

14. A connector inspecting device according to claim 11, wherein said electrical contactor is electrically connected through a lead wire to a wire harness continuity detecting circuit.

15. A connector inspecting device for inspecting a connector including a connector housing and a metal terminal inserted into said connector housing, said metal terminal being prevented from coming off by a lance disposed in said connector housing, said connector inspecting device comprising:

a connector holder for holding said connector;

a checker housing confronted with said connector holder;

driving means for moving at least one of said connector holder and said checker housing toward each other; and a slider provided in said checker housing, said slider being movable toward said connector in said checker housing, said slider including:

a lance check pin protruding toward said lance and contacting said lance when said metal terminal has been unsatisfactorily set in said connector housing;

an electrical contactor engaging said metal terminal when said metal terminal has been set at a normal position in said connector housing, thus being prevented from coming off; and urging means for urging said lance check pin and said electrical contactor toward said connector.

16. A connector inspecting device according to claim 15, wherein said checker housing comprises a cavity, and wherein said slider is movably disposed in said cavity and said lance check pin is integral with said slider.

17. A connector inspecting device according to claim 16, wherein said electrical contactor is coupled to said slider for movement with said slider.

18. A connector inspecting device according to claim 17, wherein said urging means comprises a spring disposed around said electrical contactor, said spring disposed between a rear wall of said cavity and said slider.

19. A connector inspecting device according to claim 18, wherein said cavity comprises a stop disposed on an opposite side of said slider from said rear wall, said stop limiting movement of said slider toward said connector.

20. A connector inspecting device according to claim 17, wherein said electrical contactor is electrically connected through a lead wire to a wire harness continuity detecting circuit.

* * * * *